(12) United States Patent
Kuo et al.

(10) Patent No.: US 7,679,869 B2
(45) Date of Patent: Mar. 16, 2010

(54) INPUT/OUTPUT DEVICE CAPABLE OF BLOCKING EXTERNAL INTERFERENCE SIGNALS

(75) Inventors: Bing-Jye Kuo, Hsinchu (TW); Shou-Tsung Wang, Tainan County (TW); Po-Sen Tseng, Hsinchu Hsien (TW); Chih-Chun Tang, Taipei (TW); Shin-Fu Chen, Tainan (TW)

(73) Assignee: Mediatek Inc., Hsin-Chu (TW)

( * ) Notice: Subject to any disclaimer, the term of this patent is extended or adjusted under 35 U.S.C. 154(b) by 818 days.

(21) Appl. No.: 11/468,316

(22) Filed: Aug. 30, 2006

(65) Prior Publication Data

US 2008/0062594 A1    Mar. 13, 2008

(51) Int. Cl.
*H02H 9/00* (2006.01)
(52) U.S. Cl. .................... 361/56; 361/91.1; 361/111
(58) Field of Classification Search .............. 361/56, 361/91.1, 111, 119; 307/89–91; 477/73, 477/78; 327/309–310
See application file for complete search history.

(56) References Cited

U.S. PATENT DOCUMENTS

| 4,637,073 | A | * | 1/1987 | Selin et al. ............ 455/78 |
| 5,563,757 | A | | 10/1996 | Corsi |
| 5,764,464 | A | | 6/1998 | Botker et al. |
| 5,789,970 | A | * | 8/1998 | Denham ............ 327/525 |
| 5,835,328 | A | * | 11/1998 | Maloney et al. ........ 361/111 |
| 6,842,318 | B2 | | 1/2005 | Comeau |
| 6,985,019 | B1 | * | 1/2006 | Zhou et al. ............ 327/309 |

\* cited by examiner

*Primary Examiner*—Stephen W Jackson
*Assistant Examiner*—Terrence R Willoughby
(74) *Attorney, Agent, or Firm*—Thomas, Kayden, Horstemeyer & Risley

(57) ABSTRACT

An input/output device comprises a bonding pad, a signal transport circuit, and a blocking unit. The signal transport circuit has a first terminal connected to the bonding pad and a second terminal connected to a core circuit of an IC product. The signal transport circuit is capable of transporting a signal either from the bonding pad to the core circuit or from the core circuit to the bonding pad. The blocking unit has a control terminal and is coupled between the bonding pad and the signal transport circuit. The control terminal is coupled to receive an enable signal. The blocking unit ties the bonding pad to a predetermined voltage level when the enable signal is de-asserted, thereby blocking the signal transport provided by the signal transport circuit. The blocking unit unties the bonding pad from the predetermined voltage level when the enable signal is asserted.

16 Claims, 9 Drawing Sheets

INPUT/OUTPUT DEVICE CAPABLE OF BLOCKING EXTERNAL INTERFERENCE SIGNALS

BACKGROUND OF THE INVENTION

1. Field of the Invention

The invention relates to input/output devices in an integrated circuit (IC) product and more particularly to input/output devices capable of blocking external interference signals from other input/output devices.

2. Description of the Related Art

As mobile communication has become increasingly popular, radio frequency (RF) technology has progressed and various wireless protocols, such as Bluetooth, 802.11a/b/g, GSM, TDMA, have been introduced. Some wireless protocols transmit and receive signals simultaneously, while others, such as TDMA, require that signals be transmitted and received in turns or utilizing different time slots.

For protocols requiring separate of transmission and reception, a transmitter in an RF IC is turned on while a receiver in the same RF IC is turned off, and vice versa. Ideally the transmitter and receiver operate independently and do not interfere with each other. The board on which the RF IC is mounted, however, provides a signal path that causes an unwanted feedback signal from a receiver to a transmitter, thus, output signal quality suffers during signal transmission.

FIG. 1 illustrates the origin of the feedback signal during signal transmission. In a transmission mode, transmitter 12 on an RF IC amplifies an internal signal to generate output signal 20 for radiation by antenna 16 on a board. The board typically comprises metal straps, vias and the like for constructing signal paths to convey signals. Although the signal path for output signal 20 may not be directly shorted by a signal path for a receiver in a receiving mode, the conductors on the board inevitably form parasitic capacitors that provide leakage paths for signals, particularly for high power signals. For example, parasitic capacitor 18 in FIG. 1 provides a leakage path for output signal 20, such that leakage signal 22, which is part of the output signal 20, jumps to conductor 19 on the board and heads to the input of receiver 14 in the same RF IC. Leakage signal 22 may be transferred by receiver 14 to feedback signal 10 and sent to transmitter 12 finally deteriorating output signal 20. That kind of leakage signal 22 or feedback signal 10 should be removed or minimized, if possible.

BRIEF SUMMARY OF THE INVENTION

Input/output devices in an IC product are provided. An exemplary embodiment of the input/output device comprises a bonding pad, a signal transport circuit, and a blocking unit. A first terminal of the signal transport circuit is connected to the bonding pad and a second terminal is connected to a core circuit of the IC product. The signal transport circuit is capable of transporting a signal either from the bonding pad to the core circuit or from the core circuit to the bonding pad. The blocking unit is coupled to the bonding pad and a control terminal of the blocking unit is coupled to receive an enable signal. The blocking unit ties the bonding pad to a predetermined voltage level when the enable signal is de-asserted, thereby blocking the signal transport into/from the signal transport circuit. The blocking unit unties the bonding pad to the predetermined voltage level when enable signal is asserted.

Methods of controlling an IC product with I/O devices are provided. An exemplary embodiment of an device comprises a bonding pad and a signal transport circuit. A first terminal of the signal transport circuit is connected to the bonding pad and a second terminal is connected to a core circuit of the IC product. The signal transport circuit is capable of transporting a signal either from the bonding pad to the core circuit or from the core circuit to the bonding pad. At least one I/O device, coupled to the banding pad, comprises a blocking unit with a control terminal. The control terminal is coupled to receive an enable signal. The enable signal is asserted and a signal is transportedthrough the signal transport circuit. The enable signal is de-asserted and the blocking unit ties the bonding pad to a predetermined voltage level.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 9b shows a cross section of the low voltage triggering silicon controlled rectifier device in FIG. 9a;

FIG. 10b shows a cross section of the low voltage triggering silicon controlled rectifier device in FIG. 10a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
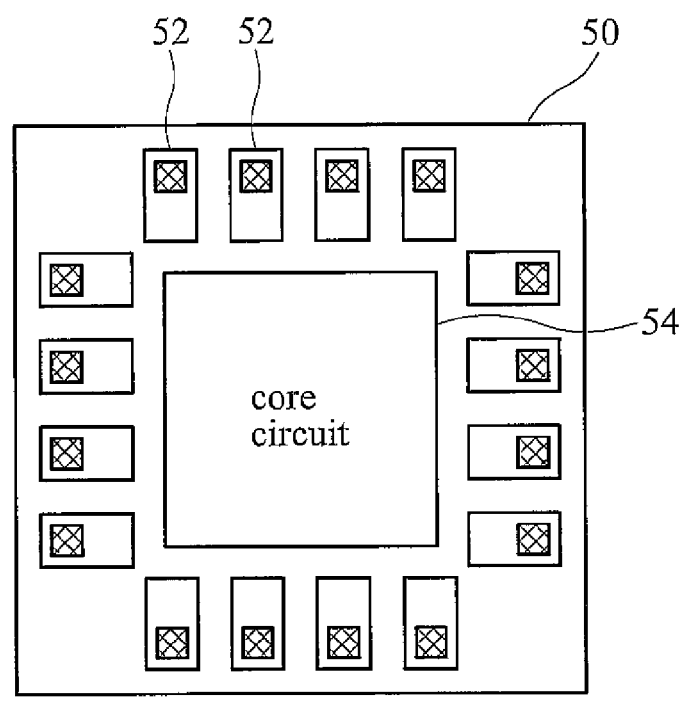
FIG. 2 shows an embodiment of an IC product with several input/output (I/O) devices enclosing a core circuit.
Figure 3:
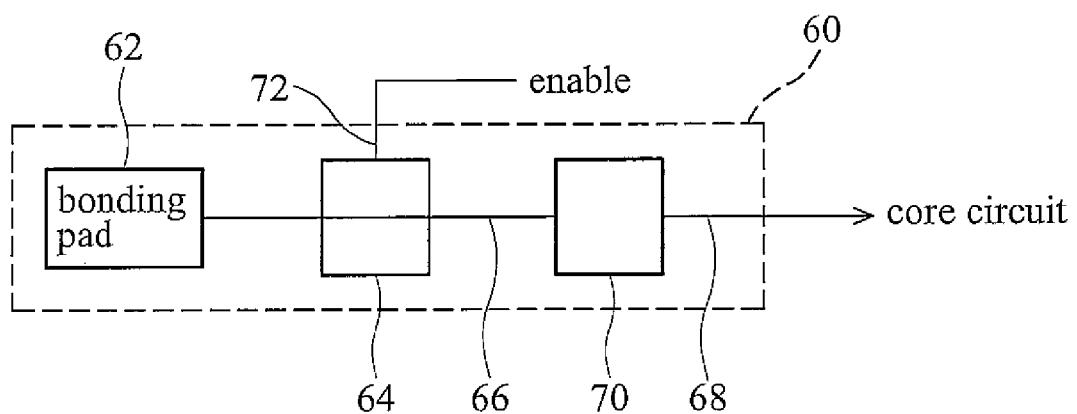
FIG. 3 shows an input/output (I/O) device of FIG. 2.

FIG. 2 shows an embodiment of an IC product 50 with several input/output (I/O) devices 52 enclosing a core circuit 54. FIG. 3 shows an input/output (I/O) device 60, which could be one of I/O devices 52 in FIG. 2. As shown in FIG. 3, I/O device 60 has a bonding pad 62, a signal transport circuit 70 and a blocking unit 64. A bonding wire (not shown) may be formed between bonding pad 62 and an IC pin (not shown) for conducting signals therebetween. Signal transport circuit 70 has a first terminal 66 connected to bonding pad 62 and a second terminal 68 connected to a core circuit (not shown). In a case where I/O device 60 is an analog or logic input device, signal transport circuit 70 transports a signal from bonding pad 62 to the core circuit. In a case where I/O device 60 is an analog or logic output device, signal transport circuit 70 on the other hand can transport a signal from the core circuit to bonding pad 62. Blocking unit 64 has a control terminal 72, coupled between bonding pad 62 and signal transport circuit 70. Control terminal 72 is coupled to receive an enable signal, as shown in FIG. 3. The enable signal from the core circuit, when de-asserted, causes the blocking unit 64 to tie bonding pad 62 to a predetermined voltage level, thereby blocking the signal transport into/from signal transport circuit 70. The effective impedance blocking unit 64 provides to bonding pad 62 must be low enough to sufficiently tie bonding pad 62 to the predetermined voltage level. For example, blocking unit 64 may sufficiently short bonding pad 62 to a power line providing the predetermined voltage level. As long as bonding pad 62 is tied to a predetermined voltage level, external signals cannot reach signal transport circuit 70 through bonding pad 62 or internal signals cannot be transported from signal transport circuit 70 to bonding pad 62. When signal transport circuit 70 is desired to perform its ability of signal transport, the enable signal is asserted, such that blocking unit 64 unties bonding pad 62 from the predetermined voltage level and signal transport circuit 70 can freely transmit a signal between bonding pad 62 and the core circuit. The predetermined voltage level may be VDD or ground directly provided by power lines.

Figure 1:
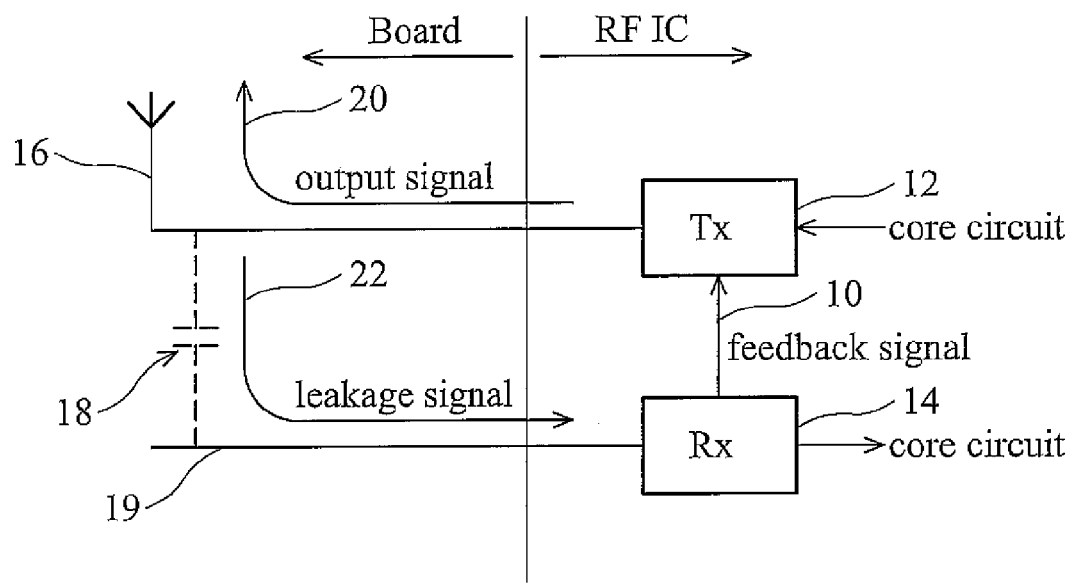
FIG. 1 illustrates the origin of the feedback signal during signal transmission.
Figure 4:
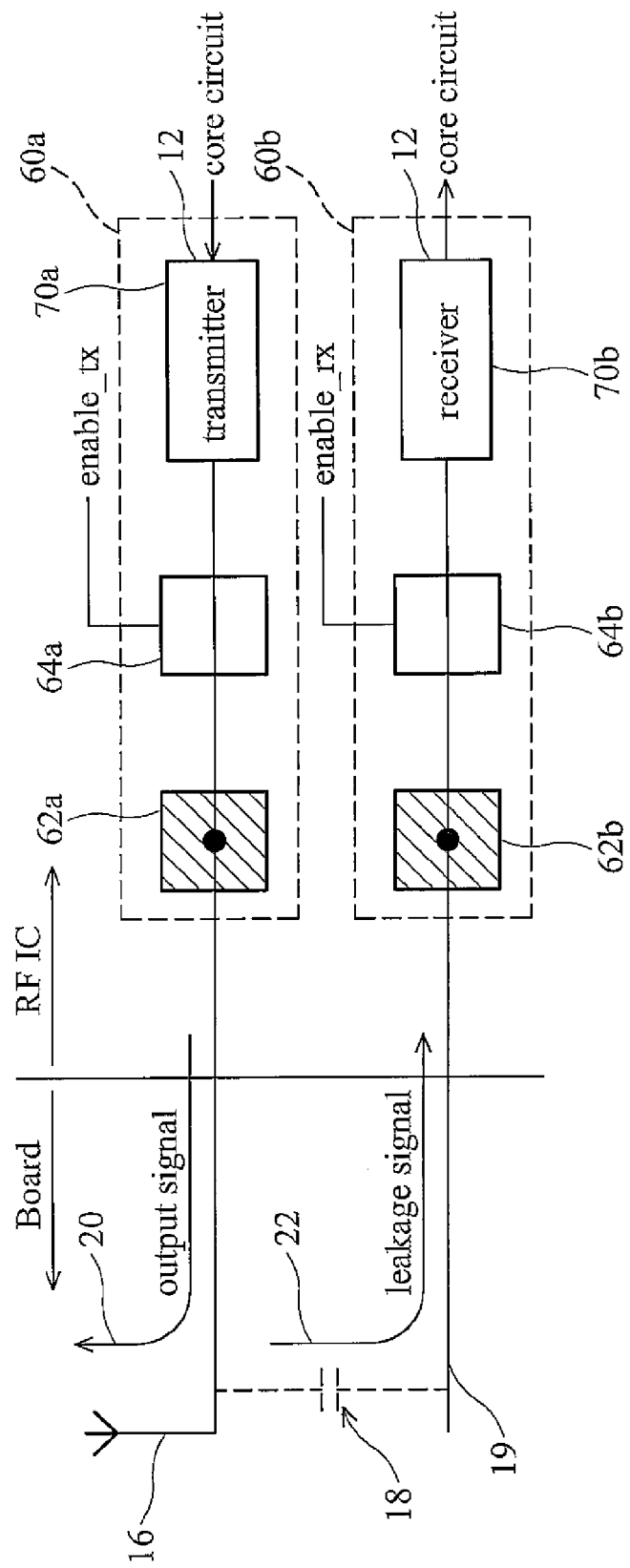
FIG. 4 illustrates how a feedback signal is removed or minimized in an embodiment of the invention.

FIG. 4 illustrates how a feedback signal is removed or minimized in an embodiment of the invention. FIG. 4 is similar to FIG. 1; hence, the same reference symbols are used for the same elements. Unlike FIG. 1, however, FIG. 4 has an input device 60a and an output device 60b, each having the same structure as that of FIG. 3. In this embodiment, the signal transport circuits of input devices 60a and 60b are respectively RF transmitter 70a and receiver 70b. Blocking unit 64a is coupled to receive signal enable_tx while blocking unit 64b receives signal enable_rx. In a transmission mode, signal enable_tx is asserted and signal enable_rx is de-asserted. Therefore, blocking unit 64a does not block the signal path from transmitter 70a and transmitter 70a can transmit output signal 20 to antenna 16 through bonding pad 62a. As long as signal enable_rx is de-asserted, blocking unit 64b blocks the signal path to receiver 70b such that leakage signal 22 will be absorbed or reflected by blocking unit 64b and prevented from reaching receiver 70b. Thus, feedback signal 10 of FIG. 1, which degrades output signal 20, no longer occurs in FIG. 4.

FIG. 4 only illustrates transaction in a transmission mode, transaction in a receiving mode is described in the following. In a receiving mode, signal enable_tx is de-asserted and signal enable_rx is asserted, such that blocking unit 64a blocks the signal path from transmitter 70a but blocking unit 64b does not block the signal path to receiver 70b. Any signal unexpectedly or accidentally output by transmitter 70a, is prevented from reaching parasitic capacitor 18 by blocking unit 64a. Thus, by eliminating interference from the output signal of transmitter 70a, receiver 70b receives an input signal from bonding pad 62b and sends it to a core circuit.

Referring to FIG. 3, although signal transport circuit 70 has been exemplified as analog circuits such as an RF receiver and transmitter, signal transport circuit 70 is not limited to this and can be any logic I/O circuit, such as a conventional inverter.

Blocking unit 64 may comprise any means capable of tying or untying the voltage level to bonding pad 62 based on the enable signal. More particularly, blocking unit 64 may be an ESD (electrostatic discharge) protection device. Conventional ESD protection devices generally are only triggered by a huge positive or negative external voltage pulse when touching an electrostatic charge source, and remain idle or inactive when properly powered. In other words, when properly powered, conventional ESD protection devices only act as passive components and require no control terminals for receiving signals. Conventional ESD protection devices are commonly required for I/O devices for sufficient immunity against ESD stress. When employed as a blocking unit in an embodiment of an I/O device, a control terminal for receiving an enable signal from a core circuit must be added to a conventional ESD protection device. This modification may not change the effective loading of the unmodified ESD protection device. If the design of a signal transport circuit with an I/O device, such as an RF I/O device, is highly sensitive to the effective loading of the bonding pad and the I/O device, the same effective loading of an ESD protection device implies that the design of the signal transport circuit can remain the same, and thus, the need for redesign of the signal transport circuit is eliminated.

Figure 5:
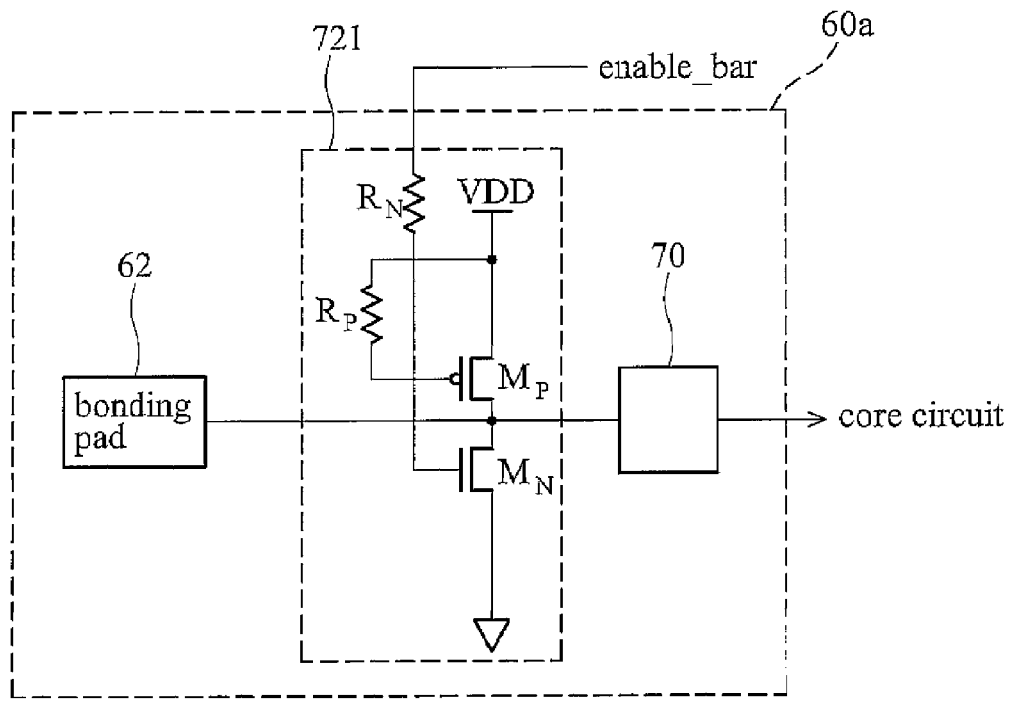
FIG. 5 shows an embodiment of an input/output (I/O) device with an ESD protection device as a blocking unit.

FIG. 5 shows an embodiment of the input/output (I/O) device 60a with an ESD protection device 721 as a blocking unit. PMOS $M_P$ has a source coupled to power line VDD, and a drain coupled to bonding pad 62. The bulk of PMOS $M_P$ (not shown) is coupled to power line VDD. The gate of PMOS $M_P$ is coupled to power line VDD directly or through resistor $R_P$ as shown in FIG. 5, and, therefore, PMOS $M_P$ is always turned off when properly powered. NMOS $M_N$ has a source coupled to ground, and a drain coupled to the drain of PMOS $M_P$. The bulk of NMOS $M_N$ (not shown) is coupled to ground. The gate of NMOS $M_N$ is the control terminal of ESD protection device 721, coupled to receive an enable_bar signal, which is always opposite to the enable signal. Resistor $R_N$ is an optional element, coupled to the gate of NMOS $M_N$, as shown in FIG. 5. When the enable_bar signal from a core circuit is at a high level, or logic 1, NMOS $M_N$ would be turned on and then bonding pad 62 would be tied to voltage ground, thereby blocking the signal path between signal transport circuit 70 and bonding pad 62. When the enable_bar signal is at a low level, or logic 0, NMOS $M_N$ and PMOS $M_P$ would be both turned off and bonding pad 62 is therefore untied from voltage ground, so that a signal on bonding pad 62 can be transmitted from or to signal transport circuit 70.

Figure 6:
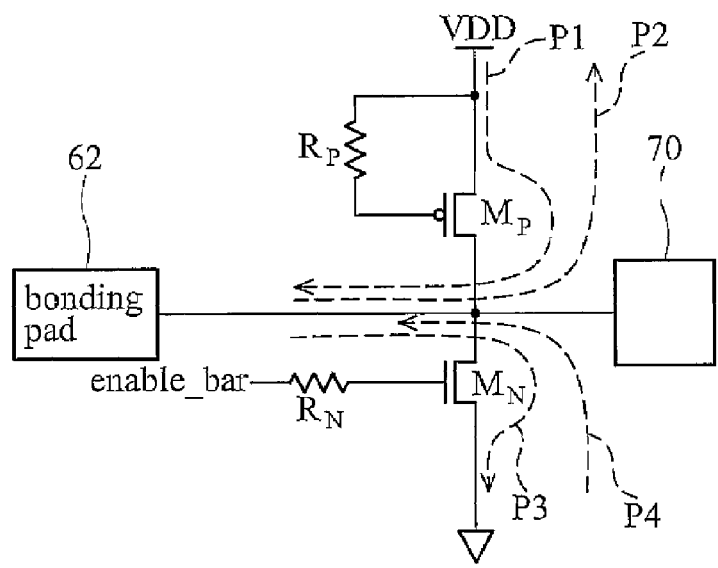
FIG. 6 shows four ESD current paths for different ESD stress conditions.

FIG. 6 shows four ESD current paths for different ESD stress conditions. For the ESD stress on bonding pad 62 negative to grounded power line VDD, the parasitic bipolar junction transistor (BJT) under PMOS $M_P$ is triggered on, thereby forming ESD current path P1 to release the ESD stress. For the ESD stress on bonding pad 62 positive to grounded power line VDD, the PN junction between the base and the drain of PMOS $M_P$ is forward biased, such that ESD current path P2 conducts charge from bonding pad 62 to VDD and releases ESD stress. For the ESD stress on bonding pad 62 positive to grounded power line ground, the parasitic BJT under NMOS $M_N$ is triggered on, thereby forming ESD current path P3 to release ESD stress. For the ESD stress on bonding pad 62 negative to grounded power line ground, the PN junction between the base and the drain of NMOS $M_N$ is forward biased, such that ESD current path P4 conducts charge to bonding pad 62 from power line ground and releases the ESD stress. For the four above-mentioned ESD stress conditions, no enable_bar signal occurs.

Figure 7A:
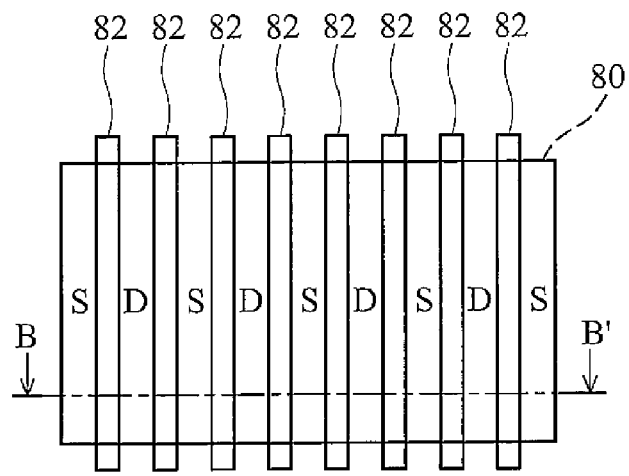
FIG. 7a shows a layout of a NMOS with a multi-finger gate.
Figure 7B:
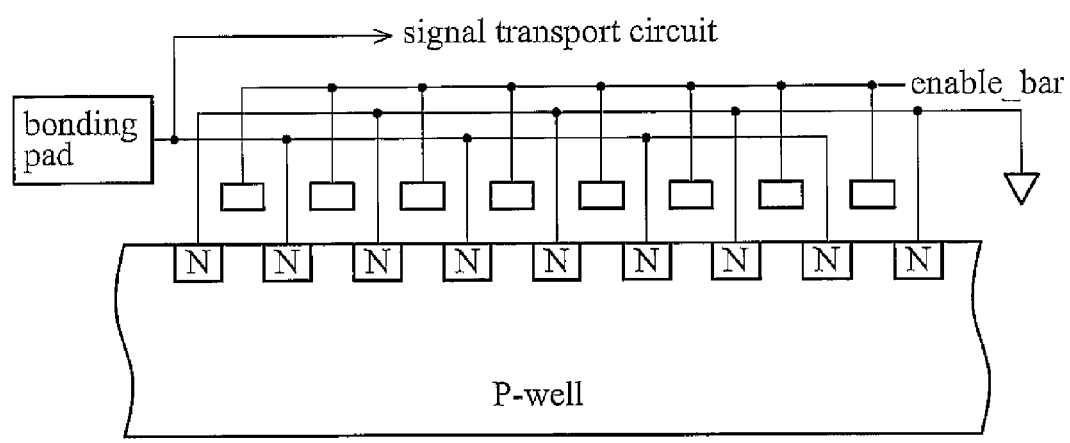
FIG. 7b shows a cross section of FIG. 7a along line BB'.

FIG. 7a shows a layout of a NMOS with a multi-finger gate and FIG. 7b shows a cross section of FIG. 7a along line BB'. NMOS $M_N$ in FIG. 6 may be the MOS with a multi-finger gate in FIG. 7a, where active region 80 defines the location of NMOS $M_N$ and fingers 82 define source and drain areas therebetween. All the fingers are connected to serve as the gate of the NMOS $M_N$, the control terminal, receiving the enable_bar signal as shown in FIG. 7b. Between every two adjacent source areas there is a drain area and between every two adjacent drain areas there is a source area, as shown in FIGS. 7a and 7b. All source areas, n type, are connected together to be the source of NMOS $M_N$, connected to power line ground. All n-type drain areas are connected to serve as the drain of NMOS $M_N$, connected to the conductor between bonding pad 62 and signal transport circuit 70. The p-well under the fingers, source areas and drain areas is the bulk of NMOS $M_N$, generally coupled to power line ground.

Figure 8:
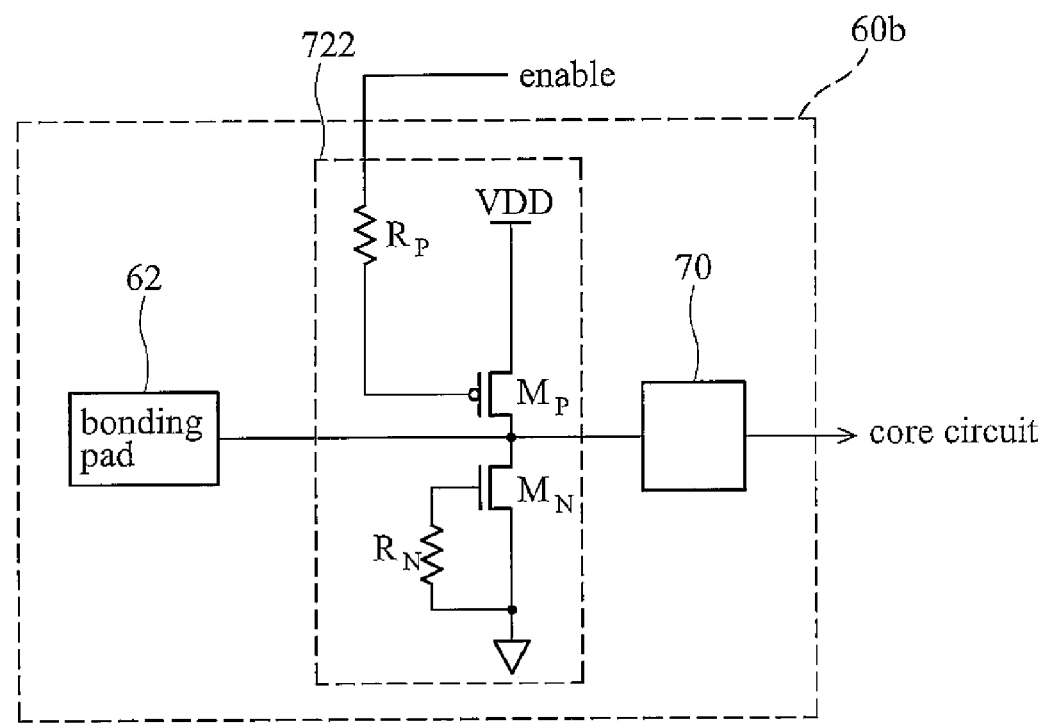
FIG. 8 shows another embodiment of an input/output (I/O) device with an ESD protection device as a blocking unit.

FIG. 8 shows an embodiment of an input/output (I/O) device 60b comprising ESD protection device 722 serving as a blocking unit. FIG. 8 is similar to FIG. 5, but differs in two aspects. The control terminal in FIG. 8 is from PMOS $M_P$ and is coupled to receive an enable signal, but the control terminal in FIG. 5 is from NMOS $M_N$ and is coupled to receive an enable_bar signal. When the enable signal is at a low level, or logic 0, PMOS $M_P$ would be turned on to short bonding pad 62 with power line VDD, tying bonding pad 62 to voltage VDD. When the enable signal is at a high level, or logic 1, PMOS $M_P$ would be turned off to untie bonding pad 62 from voltage VDD. Resistor $R_P$ in FIG. 8 is optional and can be omitted with enable connected to gate of PMOS directly.

Figure 9A:
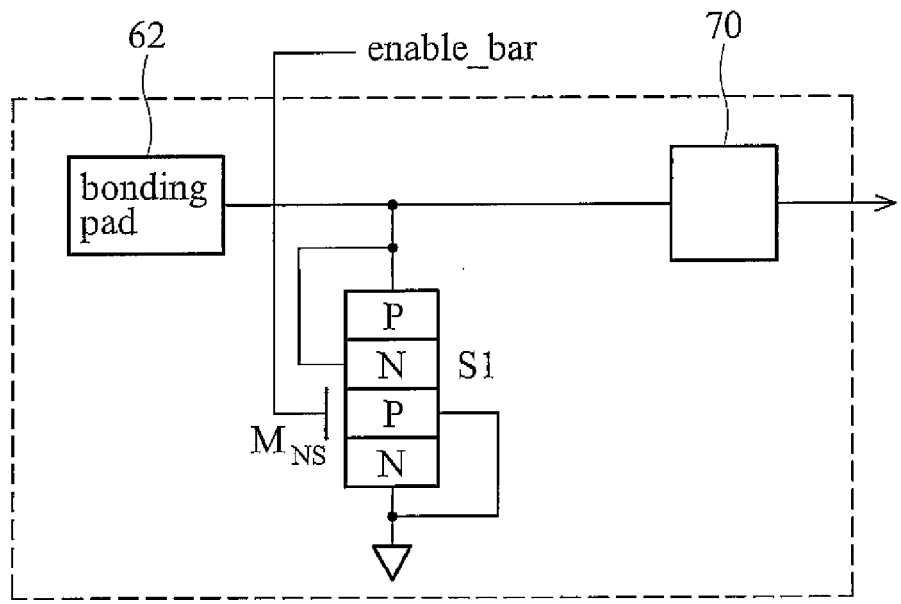
FIG. 9a shows an embodiment of an input/output (I/O) device with a low voltage triggering silicon controlled rectifier device as a blocking unit.
Figure 9B:
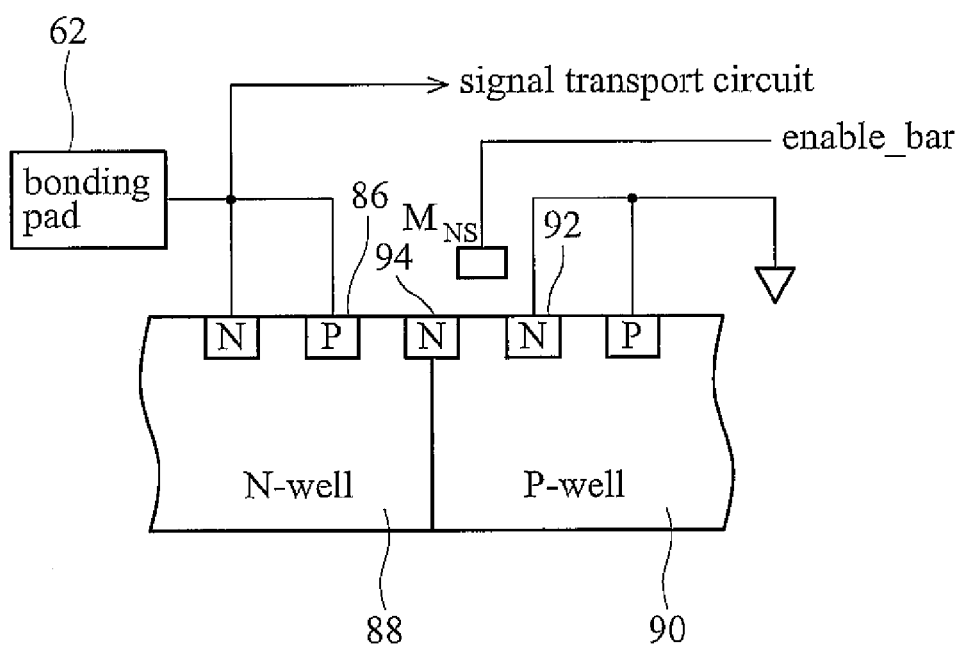

FIG. 9a shows an embodiment of an input/output (I/O) device 60c with a low voltage triggering silicon controlled rectifier (LVTSCR) device S1 as a blocking unit. FIG. 9b shows a cross section of LVTSCR S1 in FIG. 9a. An SCR device, having a four-layer structure of PNPN and a very low holding voltage, is well known in the art of ESD protection, while a LVTSCR device further has a gate and a heavily-doped region attached to the junction between the middle N and P layers. As shown in FIG. 9a, LVTSCR device S1 has a gate $M_{NS}$ coupled to receive an enable_bar signal from a core circuit. If the enable_bar signal is at a high voltage level, gate $M_{NS}$ shorts the middle N layer (coupled to bonding pad 62) with the bottom N layer (coupled to power line ground), thereby tying bonding pad 62 to voltage ground. The four-layer structure of PNPN in FIG. 9b consists of P area 86, N-well 88, P-well 90 and N area 92. P area 86 and N-well 88 are coupled to bonding pad 62 while P-well 90 and N area 92 are coupled to power line ground. N area 94 is located on the junction between N-well 88 and P-well 90, reducing the triggering voltage of the LCTSCR. Providing a high voltage level to gate $M_{NS}$ can cause formation of an inversion layer under gate $M_{NS}$ which shorts N area 94 (or N well 88) and N area 92, such that bonding pad 62 is coupled to power line ground.

Figure 10A:
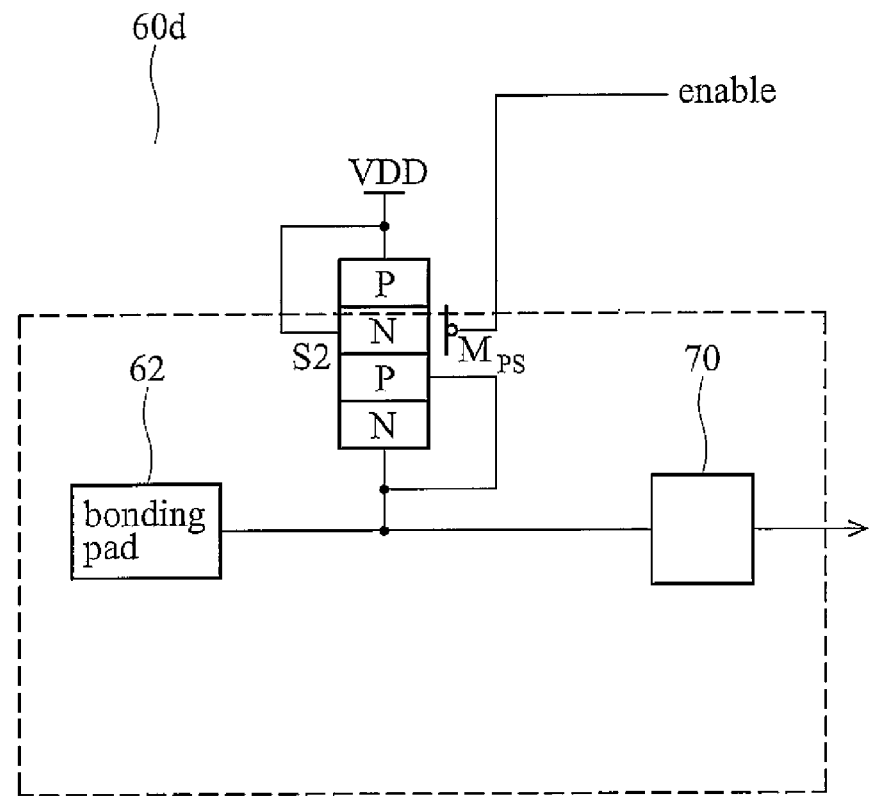
FIG. 10a shows another embodiment of an input/output (I/O) device with a low voltage triggering silicon controlled rectifier device as a blocking unit.
Figure 10B:
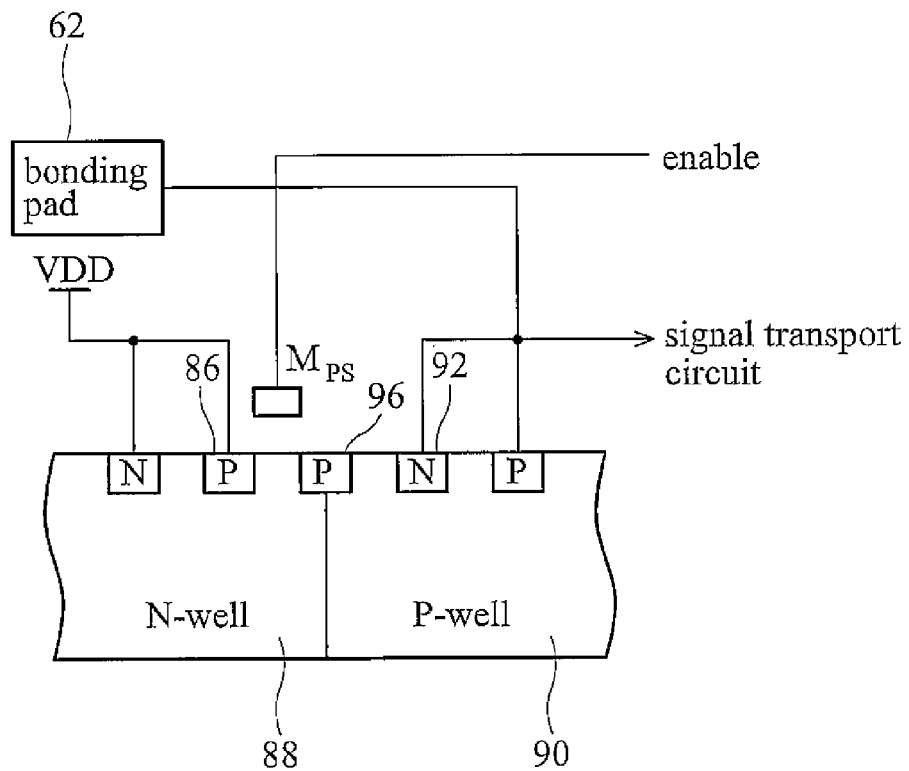

FIG. 10a shows an embodiment of an input/output (I/O) device 60d comprising a low voltage triggering silicon controlled rectifier (LVTSCR) device S2 serving as a blocking unit. FIG. 10b shows a cross section of LVTSCR S2 in FIG. 10a. As shown in FIG. 10a, LVTSCR device S2 has a gate $M_{PS}$ coupled to receive an enable signal from a core circuit. If the enable signal is at a low voltage level, gate $M_{PS}$ shorts the middle P layer (coupled to bonding pad 62) with the top P layer (coupled to power line VDD), thereby tying bonding pad 62 to voltage VDD. The four-layer structure of PNPN in FIG. 10b consists of P area 86, N-well 88, P-well 90 and N area 92. P area 86 and N-well 88 are coupled to power line VDD while P-well 90 and N area 92 are coupled to bonding pad 62. P area 96 is located on the junction between N-well 88 and P-well 90, reducing the triggering voltage of the LCTSCR. Providing a low voltage level to gate $M_{PS}$ can cause formation of an inversion layer under gate $M_{PS}$ which shorts P area 96 (or P well 90) and P area 86, such that bonding pad 62 is coupled to power line VDD.

Figure 11A:
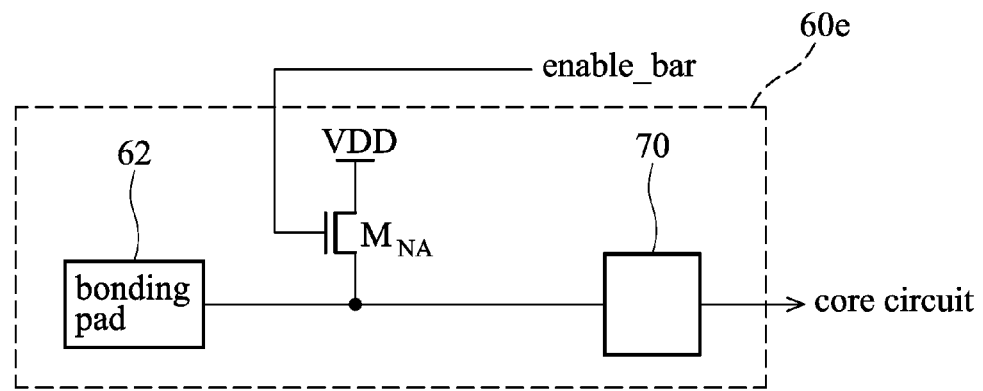
FIGS. 11a and 11b show two alternative embodiments of input/output (I/O) devices.
Figure 11B:
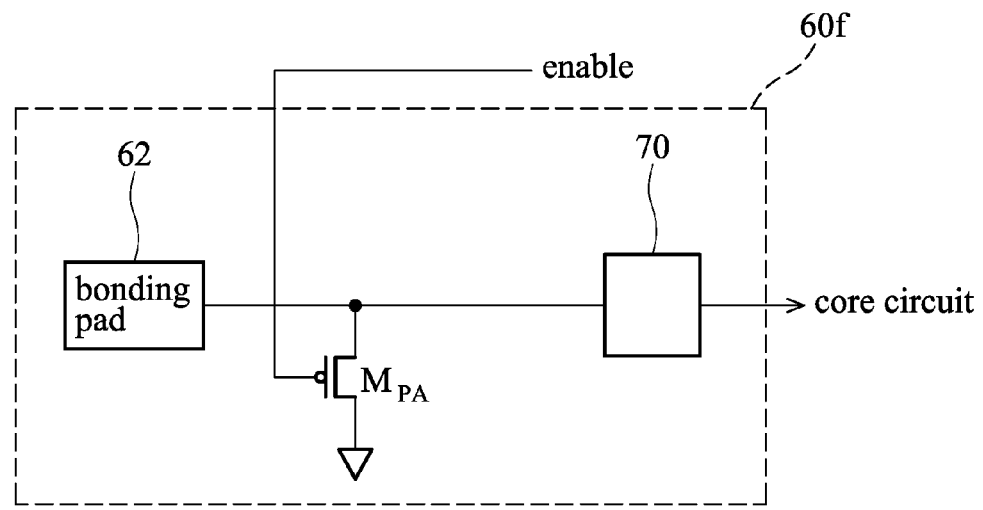

The blocking units in the aforementioned embodiments employ NMOSs to tie a bonding pad to voltage ground or PMOSs to tie the bonding pad to voltage VDD. The scope of the invention, however, is not limited thereto. If wanted, a blocking unit can also employ an NMOS to tie a bonding pad to voltage VDD or a PMOS to tie the bonding pad to voltage ground. FIGS. 11a and 11b show two alternative input/output (I/O) devices 60e and 60f. In FIG. 11a, when the enable_bar signal is at a voltage level higher than the sum of voltage VDD and $V_{tn}$, the threshold voltage of a NMOS, NMOS $M_{NA}$ ties bonding pad 62 to voltage VDD. Likewise, in FIG. 11b, when the enable signal is at a voltage level that is $V_{tp}$ lower than voltage ground, where $V_{tp}$ is the threshold voltage of a PMOS, PMOS $M_{PA}$ ties bonding pad 62 to voltage ground.

The predetermined voltage level that a blocking unit ties a bonding pad to is not necessarily voltage VDD or ground, and can be any fixed voltage level. The only requirement for a blocking unit is that it sufficiently ties a bonding pad to a predetermined voltage, such that a signal cannot be transmitted between the bonding pad and a signal transport circuit when an enable signal is de-asserted.

In comparison with conventional I/O devices, the inventive I/O devices block signal paths that may cause deterioration of the signals transmitted or received by other I/O devices, thus a better environment for signal processing may be provided.

While the invention has been described by way of examples and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input/output device in an IC product, comprising:
    a bonding pad;
    a signal transport circuit having a first terminal connected to the bonding pad and a second terminal connected to a core circuit of the IC product, capable of transporting a signal either from the bonding pad to the core circuit or from the core circuit to the bonding pad; and
    a blocking unit with a control terminal, coupled between the bonding pad and the signal transport circuit, the control terminal coupled to receive an enable signal;
    wherein the blocking unit ties the bonding pad to a predetermined voltage level when the enable signal is de-asserted, thereby blocking the signal transport provided by the signal transport circuit; and
    the blocking unit unties the bonding pad from the predetermined voltage level when enable signal is asserted.

2. The input/output device of claim 1, wherein the signal transport circuit is an RF receiver, and the enable signal is de-asserted when an RF transmitter of the IC product transmits an RF signal.

3. The input/output device of claim 1, wherein the signal transport circuit is an RF transmitter, and the enable signal is de-asserted when an RF receiver of the IC product receives an RF signal.

4. The input/output device of claim 1, wherein the blocking unit is an ESD protection device.

5. The input/output device of claim 4, wherein the ESD protection device is a MOS comprising a multi-finger gate serving as the control terminal.

6. The input/output device of claim 4, wherein the ESD protection device is an SCR device.

7. The input/output device of claim 1, wherein the predetermined voltage level is VDD or ground.

8. The input/output device of claim 4, wherein the ESD protection device is a MOS comprising a multi-finger gate coupled to one terminal of a resistor where the other terminal of the resistor is serving as the control terminal.

9. A method of controlling an IC product with I/0 devices, wherein each I/O device comprises a bonding pad, and a signal transport circuit having a first terminal connected to the bonding pad and a second terminal connected to a core circuit of the IC product, capable of transporting a signal either from the bonding pad to the core circuit or from the core circuit to the bonding pad; and at least one I/O device, coupled to the bonding pad, comprising a blocking unit comprising a control terminal for receiving an enable signal;

the method comprising:

asserting the enable signal and transporting a signal through the signal transport circuit; and de-asserting the enable signal to tie the bonding pad to a predetermined voltage level through the blocking unit.

10. The method of claim 9, wherein the signal transport circuit is an RF receiver, and the enable signal is de-asserted when an RF transmitter of the IC product transmits an RF signal.

11. The method of claim 9, wherein the signal transport circuit is an RF transmitter, and the enable signal is de-asserted when an RF receiver of the IC product receives an RF signal.

12. The method of claim 9, wherein, the blocking unit is an ESD protection device.

13. The method of claim 12, wherein the ESD protection device is a MOS comprising a multi-finger gate serving as the control terminal.

14. The method of claim 12, wherein the ESD protection device is an SCR device.

15. The method of claim 12, wherein the ESD protection device is a MOS comprising a multi-finger gate coupled to one terminal of a resistor where the other terminal of the resistor is serving as the control terminal.

16. The method of claim 9, wherein the predetermined voltage level is VDD or ground.

* * * * *